United States Patent
Pirovano et al.

(10) Patent No.: US 10,424,730 B2
(45) Date of Patent: Sep. 24, 2019

(54) TAPERED MEMORY CELL PROFILES

(71) Applicant: Micron Technology, Inc., Boise, ID (US)

(72) Inventors: Agostino Pirovano, Milan (IT); Kolya Yastrebenetsky, Boise, ID (US); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/893,106

(22) Filed: Feb. 9, 2018

(65) Prior Publication Data

US 2019/0252607 A1    Aug. 15, 2019

(51) Int. Cl.
| | |
|---|---|
| G11C 13/00 | (2006.01) |
| H01L 45/00 | (2006.01) |
| H01L 27/24 | (2006.01) |

(52) U.S. Cl.
CPC ...... *H01L 45/1273* (2013.01); *G11C 13/0004* (2013.01); *G11C 13/004* (2013.01); *H01L 27/2463* (2013.01); *H01L 45/06* (2013.01); *H01L 45/141* (2013.01); *G11C 2213/52* (2013.01); *G11C 2213/71* (2013.01)

(58) Field of Classification Search
CPC .................................................. G11C 13/0004
USPC ........................................................ 365/163
See application file for complete search history.

(56) References Cited

U.S. PATENT DOCUMENTS

| | | | |
|---|---|---|---|
| 7,049,652 B2 | 5/2006 | Mokhlesi et al. | |
| 7,550,313 B2 | 6/2009 | Arnold et al. | |
| 8,153,488 B2 * | 4/2012 | Nishitani | H01L 27/101 |
| | | | 257/314 |
| 8,222,677 B2 | 7/2012 | Baba et al. | |
| 8,847,186 B2 | 9/2014 | Redaelli et al. | |
| 9,257,431 B2 * | 2/2016 | Ravasio | H01L 45/04 |
| 9,337,422 B2 | 5/2016 | Cheong et al. | |
| 9,640,588 B2 * | 5/2017 | Sciarrillo | H01L 45/04 |
| 2006/0157683 A1 | 7/2006 | Scheuerlein | |
| 2007/0010082 A1 | 1/2007 | Pinnow et al. | |

(Continued)

FOREIGN PATENT DOCUMENTS

| | | |
|---|---|---|
| KR | 20090077232 A | 7/2009 |
| KR | 20150085155 A | 7/2015 |

OTHER PUBLICATIONS

U.S. Appl. No. 15/582,329, filed Apr. 28, 2017.

(Continued)

*Primary Examiner* — Son L Mai
(74) *Attorney, Agent, or Firm* — Holland & Hart LLP

(57) ABSTRACT

Methods, systems, and devices for tapered memory cell profiles are described. A tapered profile memory cell may mitigate shorts in adjacent word lines, which may be leveraged for accurately reading a stored value of the memory cell. The memory device may include a self-selecting memory component with a bottom surface and a top surface opposite the bottom surface. In some cases, the self-selecting memory component may taper from the bottom surface to the top surface. In other examples, the self-selecting memory component may taper from the top surface to the bottom surface. The top surface of the self-selecting memory component may be coupled to a top electrode, and the bottom surface of the self-selecting memory component may be coupled to a bottom electrode.

20 Claims, 11 Drawing Sheets

(56) References Cited

U.S. PATENT DOCUMENTS

| | | |
|---|---|---|
| 2007/0063180 A1 | 3/2007 | Asano et al. |
| 2007/0097739 A1 | 5/2007 | Happ et al. |
| 2007/0238225 A1 | 10/2007 | Wicker |
| 2007/0246782 A1 | 10/2007 | Philipp et al. |
| 2008/0019170 A1 | 1/2008 | Happ et al. |
| 2008/0044632 A1 | 2/2008 | Liu et al. |
| 2010/0044664 A1 | 2/2010 | Liu |
| 2011/0032753 A1 | 2/2011 | An et al. |
| 2012/0069645 A1 | 3/2012 | Goux et al. |
| 2012/0282752 A1 | 11/2012 | Lee et al. |
| 2014/0034892 A1 | 2/2014 | Erbetta et al. |
| 2014/0256110 A1 | 9/2014 | Lung et al. |
| 2015/0028280 A1 | 1/2015 | Sciarrillo et al. |
| 2015/0200368 A1 | 7/2015 | Lee et al. |
| 2015/0255507 A1 | 9/2015 | Pakala et al. |
| 2015/0372227 A1 | 12/2015 | Liu |
| 2017/0040533 A1 | 2/2017 | Marsh et al. |
| 2017/0117467 A1 | 4/2017 | Chang et al. |
| 2017/0125097 A1 | 5/2017 | Tortorelli et al. |
| 2017/0207387 A1 | 7/2017 | Yang et al. |
| 2017/0346003 A1 | 11/2017 | Liu |
| 2019/0058109 A1 | 2/2019 | Chen et al. |

OTHER PUBLICATIONS

U.S. Appl. No. 15/621,939, filed Jun. 13, 2017.

ISA/KR, International Search Report of the International Searching Authority, Int'l. Appl. No. PCT/US2018/028391, dated Aug. 9, 2018, Korean Intellectual Property Office, Seo-gu, Daejeon, Republic of Korea, 14pgs.

ISA/KR, International Search Report and Written Opinion of the International Searching Authority, Int'l. Appl. No. PCT/US2019/015671, dated May 14, 2019, Korean Intellectual Property Office, Seo-gu, Daejeon, Republic of Korea, 15 pgs.

ISA/KR, International Search Report and Written Opinion of the International Searching Authority, Int'l. Appl. No. PCT/US2019/015678, dated May 15, 2019, Korean Intellectual Property Office, Seo-gu, Daejeon, Republic of Korea, 15 pgs.

ISA/KR, International Search Report and Written Opinion of the International Searching Authority, Int'l. Appl. No. PCT/US2019/015683, dated May 15, 2019, Korean Intellectual Property Office, Seo-gu, Daejeon, Republic of Korea, 13 pgs.

* cited by examiner

TAPERED MEMORY CELL PROFILES

BACKGROUND

The following relates generally to tapered memory cell profiles and more specifically to tapered self-selecting memory cell profiles.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

Some types of memory devices may use variations in resistance across a cell to program and sense different logic states. For example, in a self-selecting memory cell a logic state may be stored based on a distribution of charges and/or ions and/or elements within the memory cell.

DETAILED DESCRIPTION

Figure 1:
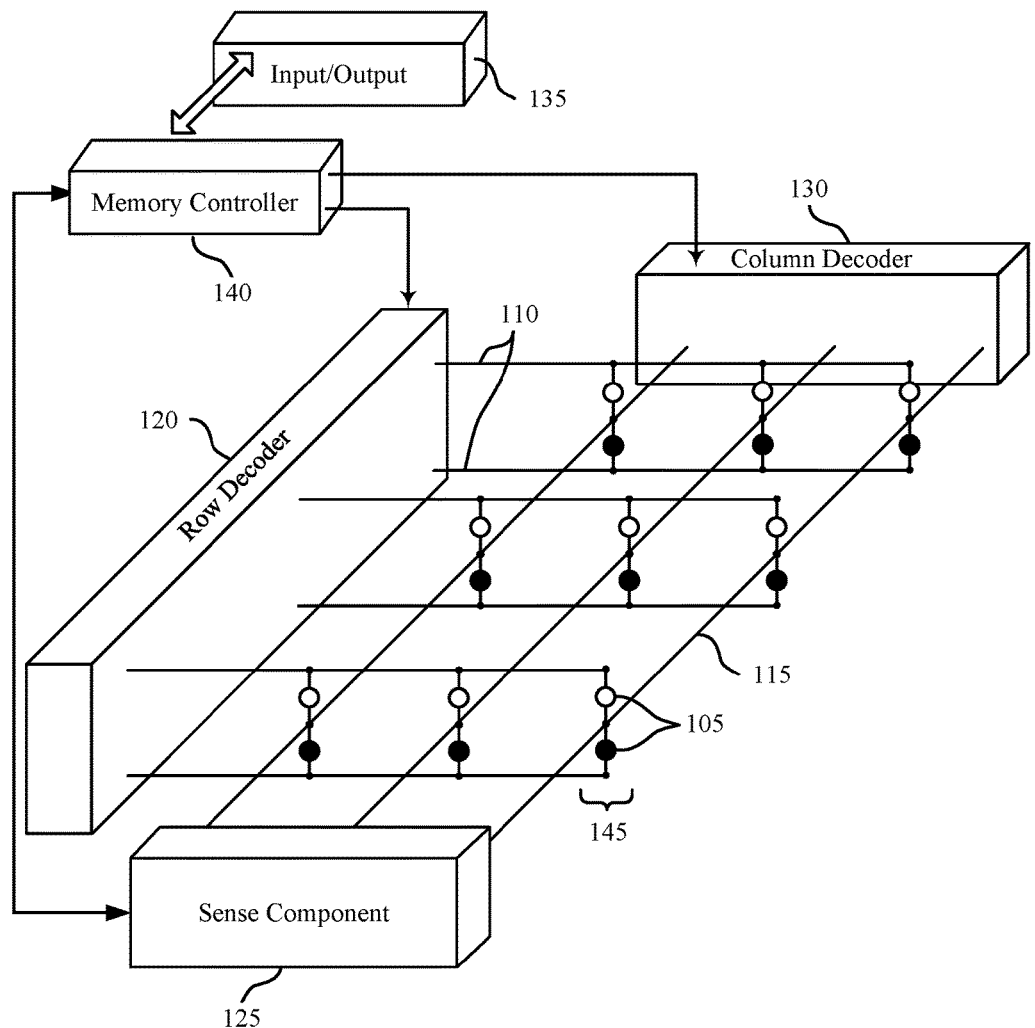
FIG. 1 illustrates an example memory array that supports tapered memory cell profiles in accordance with examples of the present disclosure.

A self-selecting memory cell with a tapered profile (among other geometric profiles) may affect a distribution of ions in a memory cell. As the distribution of ions in the memory cell changes, it may affect a threshold voltage of the memory cell and may be used to store different programmed states. For example, applying a particular programming pulse may cause ions to crowd at or near a particular electrode of a cell. Taper profiles, or other geometric profiles, may enhance the sense window for the cell, which may result in more accurate sensing compared to cells with a straight profile. A self-selecting memory cell with a tapered profile may mitigate shorts between adjacent word lines connected to the cell. This in turn may also enhance the sense window for the cell by enhancing the sensing window for a negative threshold voltage of the memory cell.

The manner in which a cell is also designed and/or its geometric profile may cause a short to occur between adjacent word lines connected to the cell. For example, by tapering a memory cell component the distances between conductive lines in contact with the narrow end of the memory cell component may be closer together than other designs. If these conductive lines are placed too close together, it may cause unwanted coupling in a memory cell or other defects. The short between adjacent conductive lines may therefore affect the accuracy in which cells may be read and reduce the product yield from the cell.

Increased sensing reliability in a self-selecting memory device with tapered profiles and/or other geometric profiles may be realized with a profile that mitigates shorts between adjacent conductive lines (e.g., word lines). Each memory cell may be configured such that, when programmed, ions within the cell migrate toward one electrode. Due to a tapered profile, a greater density of ions may build up at or near one electrode. This may create a region with a high density of ion migration and a region with a low density of ion migration within the cell. Depending on the polarity of the memory cell, this concentration of migrating ions may represent a logic "1" or logic "0" state.

A self-selecting memory device may include a self-selecting memory component positioned between a bottom electrode and a top electrode. The self-selecting memory component of the self-selecting memory device may have a variety of different tapered profiles to mitigate or prevent unwanted coupling between conductive lines (e.g., shorts between word lines). For example, the self-selecting memory component may have a straight profile in the word line direction (e.g., a non-tapered profile), and the self-selecting memory component may have a tapered profile that extends from the bottom electrode to the top electrode in the digit line direction.

Alternatively, a self-selecting memory component of a self-selecting memory device may not include a tapered profile. Rather, the self-selecting memory component may extend along one of the conductive lines thereby causing the interface with that conductive line to be larger than the interface with the other conductive line. In such examples, the self-selecting memory component may have a straight profile in the word line direction, and the self-selecting memory component may have a straight profile in the digit line direction.

In some cases, a self-selecting component of the self-selecting memory device may have an inverted taper profile with the taper extending from the top electrode to the bottom electrode. For example, the self-selecting memory component may have a tapered profile in the word line direction, and the self-selecting memory component may have a straight profile in the digit line direction. In another example, the self-selecting memory component may have a tapered profile in the word line direction, and the self-selecting memory component may have a tapered profile in the digit line direction.

Features of the disclosure introduced above are further described below in the context of a memory array. Self-selecting memory cells with a tapered profile are illustrated and depicted in the context of a cross-point architecture. These and other features of the disclosure are further illustrated by and described with reference to apparatus diagrams, system diagrams, and flowcharts that relate to tapered memory cell profiles.

FIG. 1 illustrates an example memory array 100 that supports tapered memory cell profiles in accordance with various examples of the present disclosure. Memory array 100 may also be referred to as an electronic memory apparatus. Memory array 100 includes memory cells 105 that are programmable to store different states. Each memory cell 105 may be programmable to store two states, denoted a logic "0" and a logic "1." In some cases, memory cell 105 is configured to store more than two logic states.

A memory cell 105 may include a chalcogenide material, which may be referred to as a self-selecting memory component, that has a variable and configurable threshold voltage or electrical resistance, or both, that is representative of the logic states. In some examples, a threshold voltage of a cell changes depending on a polarity of a pulse used to program the cell. For example, a self-selecting memory cell programmed with one polarity may have certain resistive properties and thus one threshold voltage. And that self-selecting memory cell may be programmed with a different polarity that may result in different resistive properties of the cell and thus a different threshold voltage. As discussed above, when a self-selecting memory cell is programmed, elements within the cell may separate, causing redistribution of charges and/or ions and/or elements within the memory cell 105. As used herein, the term "ions" may relate to any of these possibilities. Ions may migrate toward a particular electrode, depending on the given cell's polarity. For example, in a self-selecting memory cell, ions may migrate toward the negative electrode. The memory cell may then be read by applying a voltage across the cell to sense which electrode ions have migrated toward. In some examples, cations may migrate towards one of the electrodes while anions may migrate towards the other of the electrodes.

In some examples, cell programming may exploit the crystalline structure or atomic configuration to achieve different logic states. For example, a material with a crystalline or an amorphous atomic configuration may have different electrical resistances. A crystalline state may have a low electrical resistance and may, in some cases, be referred to as the "set" state. An amorphous state may have a high electrical resistance and may be referred to as the "reset" state. A voltage applied to the memory cell 105 may thus result in different currents depending on whether the material is in a crystalline or an amorphous state, and the magnitude of the resulting current may be used to determine the logic state stored by memory cell 105.

In some cases, a material in the amorphous, or reset, state may have a threshold voltage associated with it—that is, current flows after the threshold voltage is exceed. Thus, if the applied voltage is less than the threshold voltage, no current may flow if the memory element is in the reset state; if the memory element is in the set state, it may not have a threshold voltage (i.e., a threshold voltage of zero) and, thus, a current may flow in response to the applied voltage. In other cases, the memory cell 105 may have a combination of crystalline and amorphous areas that may result in intermediate resistances, which may correspond to different logic states (i.e., states other than logic 1 or logic 0) and may allow memory cells 105 to store more than two different logic states. As discussed below, the logic state of a memory cell 105 may be set by heating, including melting, the memory element.

Memory array 100 may be a three-dimensional (3D) memory array, where two-dimensional (2D) memory arrays are formed on top of one another. This may increase the number of memory cells that may be formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145.

Each row of memory cells 105 is connected to an access line 110 and an access line 115. Access lines 110 may also be known as word lines 110, and bit lines 115, respectively. Bit lines 115 may also be known digit lines 115. References to word lines and bit lines, or their analogues, are interchangeable without loss of understanding or operation. Word lines 110 and bit lines 115 may be substantially perpendicular to one another to create an array. The two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible; for example, memory cell 105 may have a tapered profile.

In general, one memory cell 105 may be located at the intersection of two conductive lines such as a word line 110 and a digit line 115. This intersection may be referred to as a memory cell's address. A target memory cell 105 may be a memory cell 105 located at the intersection of an energized word line 110 and digit line 115; that is, a word line 110 and digit line 115 may be energized in order to read or write a memory cell 105 at their intersection. Other memory cells 105 that are in electronic communication with (e.g., connected to) the same word line 110 or digit line 115 may be referred to as untargeted memory cells 105.

As discussed above, electrodes may be coupled to a memory cell 105 and a word line 110 or a digit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and digit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Upon selecting a memory cell 105, a migration of, for example, ions may be leveraged to set a logic state of the cell.

To read the cell, a voltage may be applied across memory cell 105 and the resulting current or the threshold voltage at which current begins to flow may be representative of a logic "1" or a logic "0" state. The crowding of ions at one or the other ends of self-selecting memory component may affect the resistivity and/or the threshold voltage, resulting in greater distinctions in cell response between logic states.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and digit line 115) and the magnitude of the resulting current may depend on the electrical resistance of the memory cell 105. Likewise, a current may be applied to a memory cell 105 and the magnitude of the voltage to create the current may depend on the electrical resistance of the memory cell 105. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may be connected to or in electronic communication with column decoder 130 or row decoder 120.

A memory cell 105 may be programmed, or written, by similarly activating the relevant word line 110 and digit line 115—i.e., a logic value may be stored in the memory cell 105. Column decoder 130 or row decoder 120 may accept data, for example input/output 135, to be written to the memory cells 105. In the case of phase change memory or self-selecting memory, a memory cell 105 may be written by heating the self-selecting memory component, for example, by passing a current through the self-selecting memory component. Depending on the logic state written to memory cell 105—e.g., logic "1" or logic "0"— ions may crowd at or near a particular electrode. For example, dependent on the polarity of memory cell 105, ion crowding at or near a first electrode may result in a first threshold voltage representative of a logic "1" state and ion crowding at or near a second electrode may result in a second threshold voltage, different from the first, representative of a logic "0" state. The first threshold voltage and second threshold voltage may, for example, be determined during a read operation performed in a predetermined polarity. The difference between the first and second threshold voltages may be more pronounced in a self-selecting memory component that is tapered, including those described with reference to FIGS. 3-7.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM and/or self-selecting memory, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM and/or self-selecting memory cells may have beneficial properties that may result in improved performance relative to other memory architectures. For example, PCM and/or self-selecting memory may offer comparable read/write speeds as DRAM but may be non-volatile and allow for increased cell density.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105.

In general, the amplitude, the polarity, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
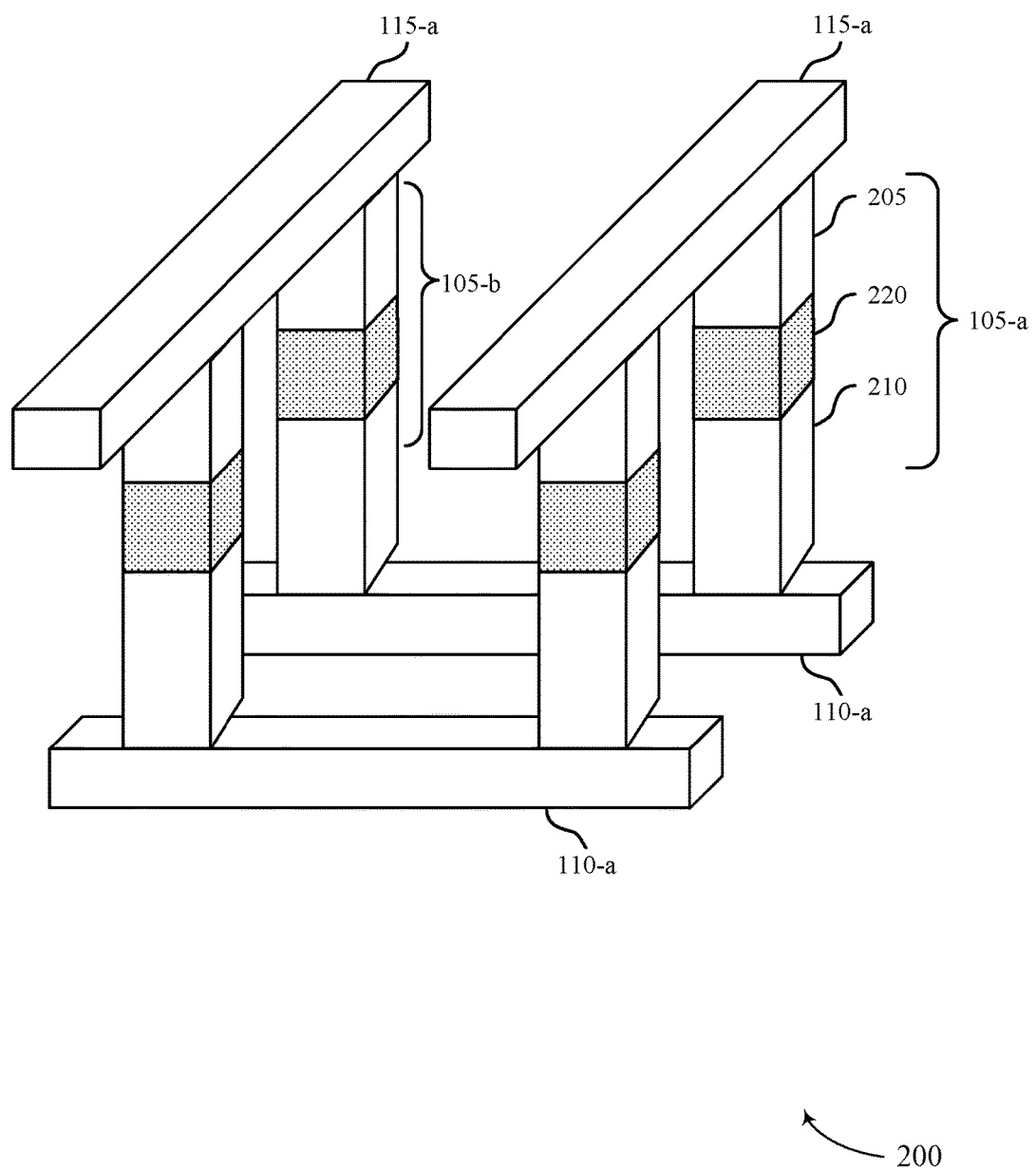
FIG. 2 illustrates an example memory array that supports tapered memory cell profiles in accordance with examples of the present disclosure.

FIG. 2 illustrates an example memory array 200 that supports reading and writing non-volatile memory cells and programming enhancement in memory cells in accordance with various examples of the present disclosure. Memory array 200 may be an example of memory array 100 with reference to FIG. 1.

Memory array 200 may include memory cell 105-*a*, memory cell 105-*b*, word line 110-*a*, and digit line 115-*a*, which may be examples of a memory cell 105, word line 110, and digit line 115, as described with reference to FIG. 1. Memory cell 105-*a* may include electrode 205 (e.g., top electrode), electrode 210 (e.g., a bottom electrode), and self-selecting memory component 220. The logic state of memory cell 105-*a* may be based on at least one characteristic of self-selecting memory component 220. Memory cell 105-*b* may include a top electrode, bottom electrode, and self-selecting memory component similar to memory cell 105-*a*. some cases, a 3D memory array may be formed by stacking multiple memory arrays 200 on one another. The two stacked arrays may, in some examples, have common conductive lines so each level may share word line 110-*a* or digit line 115-*a*. Memory cell 105-*a* may depict a target memory cell—i.e., a target of a sensing operation, as described elsewhere herein.

The architecture of memory array 200 may be referred to as a cross-point architecture. It may also be referred to as a pillar structure. For example, as shown in FIG. 2, a pillar may be in contact with a first conductive line (e.g., access line such as word line 110-*a*) and a second conductive line (e.g., access line such as digit line 115-*a*). The pillar may comprise memory cell 105-*a*, where memory cell 105-*a* includes a first electrode (e.g., top electrode 205), self-selecting memory component 220, and a second electrode (e.g., bottom electrode 210). Self-selecting memory component 220 may have a tapered profile (including those described with reference to FIGS. 3-7). This tapered profile may cause ion crowding at the top electrode 205 or bottom electrode 210, depending on the polarity of memory cell 105-*a*. Ion crowding at top electrode 205 or bottom electrode 210 may allow for more-accurate sensing of memory cell 105-*a*, as described above. In addition, this tapered profile may mitigate shorts between adjacent word lines The cross-point or pillar architecture depicted in FIG. 2 may offer relatively high-density data storage with lower production costs compared to other memory architectures. For example, the cross-point architecture may have memory cells with a reduced area and thus an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

In some examples, memory array 200 may be operated using a positive voltage source and the magnitude of an intermediary voltage is between the magnitude of the positive voltage source and a virtual ground. In some examples, both bit line access voltage and word line access voltage are maintained at an intermediary voltage prior to an access operation of memory cell 105-*a*. And during an access operation, bit line access voltage may be increased (e.g., to a positive supply rail) while word line access voltage may be simultaneously decreased (e.g., to a virtual ground), generating a net voltage across memory cell 105-*a*. The threshold voltage at which current begins to flow through memory cell 105-*a* as a result of applying a voltage across memory cell 105-*a* may be a function of ion migration toward top electrode 205 or bottom electrode 210, which in turn may vary with the shape of self-selecting memory component 220.

Self-selecting memory component 220 may, in some cases, be connected in series between a first conductive line and a second conductive line, for example, between word line 110-*a* and digit line 115-*a*. For example, as depicted in FIG. 2, self-selecting memory component 220 may be located between top electrode 205 and bottom electrode 210; thus, self-selecting memory component 220 may be located in series between digit line 115-*a* and word line 110-*a*. Other configurations are possible. As mentioned above, self-selecting memory component 220 may have a threshold voltage such that a current flows through self-selecting memory component 220 when the threshold voltage is met or exceeded. The threshold voltage may depend on the programming of memory cell 105-*a* and the shape of self-selecting memory component 220.

Self-selecting memory component 220 may be arranged in a series configuration between the word line 110-*a* and digit line 115-*a*. Self-selecting memory component 220 may include a chalcogenide glass comprising selenium (Se). In some examples, self-selecting memory component 220 comprises a composition of at least one of selenium, arsenic (As), tellurium (Te), silicon (Si), germanium (Ge), or antimony (Sb). When a voltage is applied across the self-selecting memory component 220 (or when there is a voltage difference between top electrode 205 and bottom electrode 210, ions may migrate toward one or the other electrode. Self-selecting memory component 220 may also serve as a selector device. This type of memory architecture may be referred to as self-selecting memory.

3A-3B illustrate an example self-selecting memory component 220-*a* that supports tapered memory cell profiles in accordance with examples of the present disclosure. The self-selecting memory component 220-*a* is shown from a first perspective view 300-*a* and a second perspective view 300-*b* different from the first perspective view 300-*a*.

Self-selecting memory component 220-*a* includes a first surface 305 and a second surface 310 positioned opposite the second surface 310. Self-selecting memory component 220-*a* may also include length 315, length 320, length 330, and length 325. Length 315 and length 330 may determine the dimensions and area of the first surface 305, and length 320 and length 325 may determine the dimensions and area of the second surface 310. In some cases, the second surface 310 may have a greater area than first surface 305.

Figure 4A:
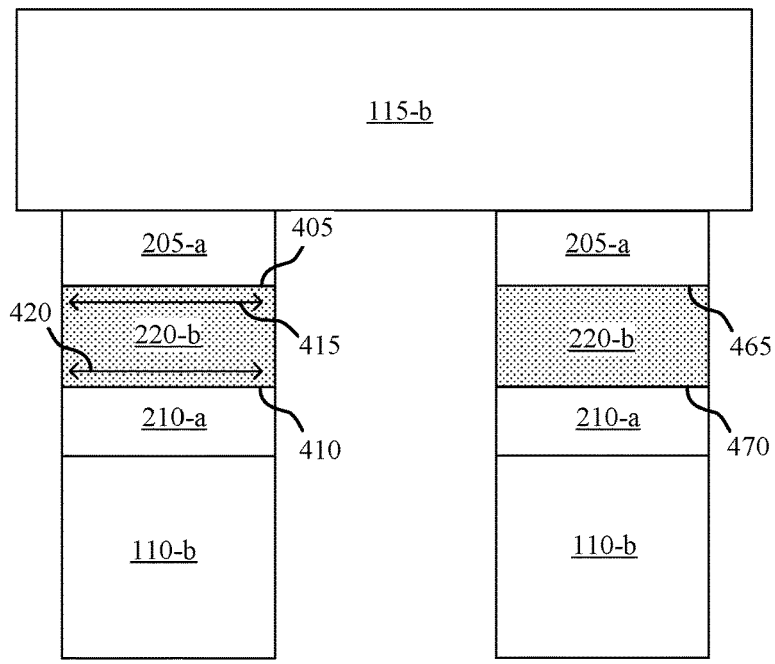
FIGS. 4A-4B illustrate an example of a memory array that supports tapered memory cell profiles in accordance with examples of the present disclosure.
Figure 4B:
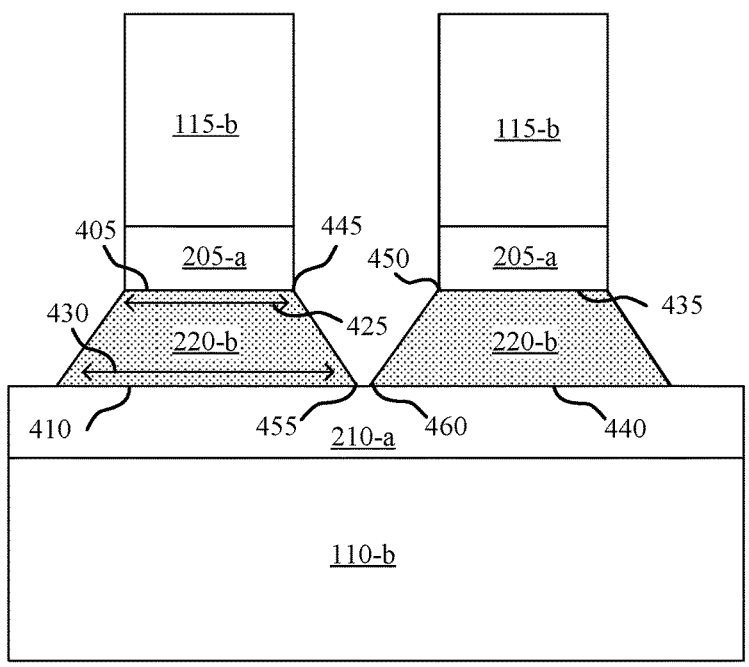

Self-selecting memory component 220-*a* may include a taper from the second surface 310 to the first surface 305 by varying the dimensions of lengths 315, 320, 325, and 330. In some cases, length 320 may be greater than length 315, and length 330 may be equal to length 325. In some cases, the second surface 310 (e.g., the larger surface) may be positioned as the bottom surface of the self-selecting memory component, as shown in the examples of FIGS. 4A and 4B. In some cases, the second surface 310 (e.g., the larger surface) may be positioned as the top surface of the self-selecting memory component, as shown in the examples of FIGS. 6A, 6B, 7A, and 7B.

Self-selecting memory component 220-*a* may form different geometric shapes. For example, self-selecting memory component 220-*a* may be in the shape of a trapezoidal prism, and a cross-section of self-selecting memory component 220-*a* may include a trapezoid in a first direction and a rectangle in a second direction. Alternatively, self-selecting memory component 220-*a* may be in the shape of an inverted trapezoidal prism, and a cross section of self-selecting memory component 220-*a* may include an inverted trapezoid in a first direction and a rectangle in a second direction. In some cases, self-selecting memory component 220-*a* may be a frustum. A frustum, as used herein, includes a shape of or resembling the portion of a cone or pyramid with the upper portion removed, or a shape of or resembling the portion of a cone or pyramid between a first plane that intercepts the cone or pyramid below the top and a second plane at or above the base.

Figure 3A:
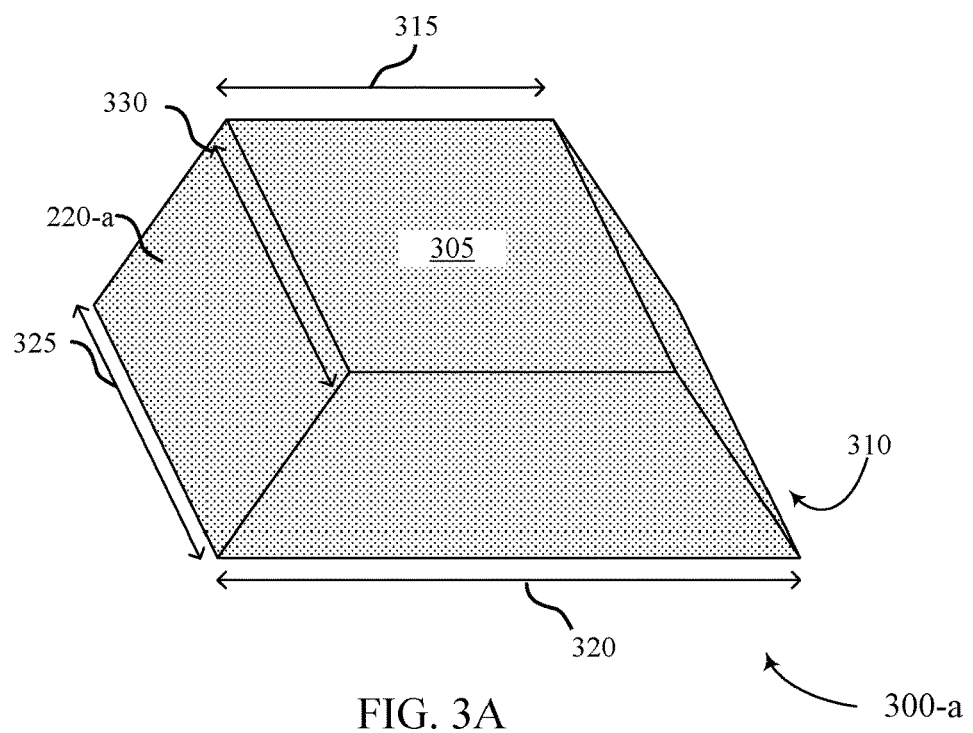
FIGS. 3A-3B illustrate an example self-selecting memory component that supports tapered memory cell profiles in accordance with examples of the present disclosure.
Figure 3B:
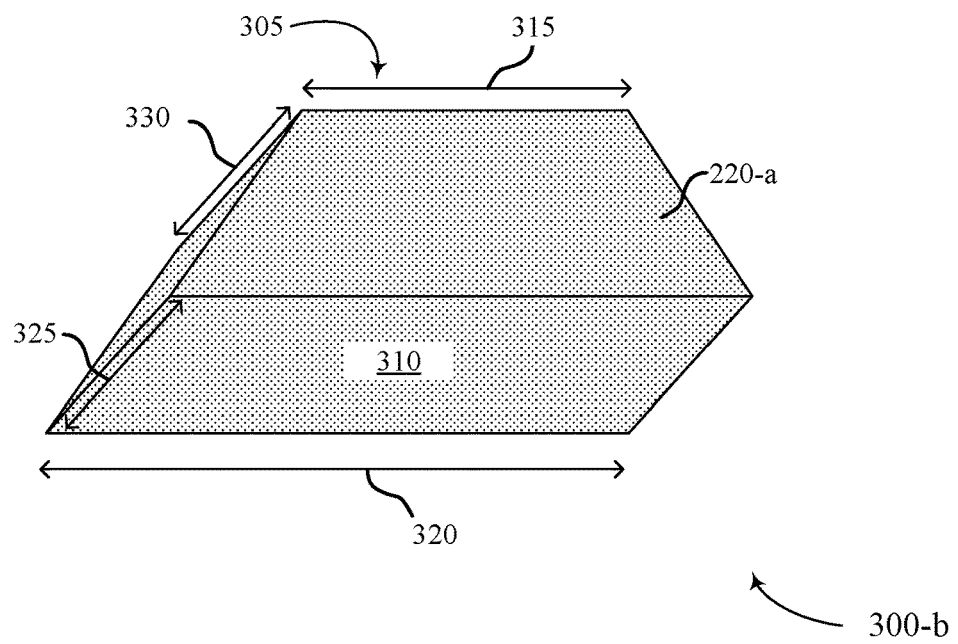

While the example of FIG. 3 depicts self-selecting memory component 220-*a* having essentially trapezoidal shapes, a person of skill in the art will appreciate that many other shapes or taper profiles may be appropriate. For example, self-selecting memory component 220-*a* may have a triangular prism shape, a pyramidal shape, a conical shape (e.g., a taper profile having curved edges), curved profiles, etc. In some examples, it may be desirable for the geometry of self-selecting memory component 220-*a* to be consistent across memory cells. Such consistency may yield more uniform and predictable device behavior. In some examples, self-selecting memory component 220-*a* of memory cells on a first portion of the memory array may all have a first taper profile while self-selecting memory component 220-*a* of memory cells on a second portion of the memory array may all have a second taper profile.

In addition, while the examples depicted herein focus on tapered profiles that may monotonically increase or decrease along a given direction, this is not required. For example, the shape of self-selecting memory component 220-*a* may be an hourglass shape or any other shape that does not monotonically increase or decrease in size. In some examples, the shape of self-selecting memory component 220-*a* may be barrel-like tapered profile or a stepped profile.

FIGS. 4A-4B illustrate an example of a memory array that supports tapered memory cell profiles in accordance with examples of the present disclosure. Self-selecting memory component 220-*b* is shown from a first cross-sectional view 400-*a* in a word line etch direction and a second cross-sectional view 400-*b* in a digit line etch direction. The self-selecting memory component 220-*b* may be coupled to top electrode 205-*a* and bottom electrode 210-*a*. The self-selecting memory component 220-*b* may have a straight profile of in a word line direction (e.g., second direction) and a tapered profile in a digit line direction (e.g., first direction). Top electrode 205-*a* may be coupled to digit line 115-*b* and bottom electrode 210-*a* may be coupled to word line 110-*b*.

Self-selecting memory component 220-*b* includes top surface 405 and bottom surface 410. Top surface 405 may be opposite of bottom surface 410. In the word line direction, length 415 (e.g., second top length) may be equal to length 420 (e.g., second bottom length). Therefore, the cross-section of self-selecting memory component 220-*b* may be a rectangle in the word line direction. In the digit line direction, length 425 (e.g., first top length) may be less than length 430 (e.g., first bottom length). Therefore, the cross-section of self-selecting memory component 220-*b* may be a trapezoid in the digit line direction. Self-selecting memory component 220-*b* may be a trapezoidal prism. In some cases, bottom surface 410 may have a greater area than top surface 405. Bottom surface 410 may also have a greater area than top surface 405 coupled with word line 110-*b*.

In some cases, the area of contact between bottom electrode 210-*a* and bottom surface 410 of self-selecting memory component 220-*b* may be an electrode interface. Similarly, the area of contact between top electrode 205-*a* and top surface 405 of self-selecting memory component 220-*a* may be an electrode interface. The bottom surface 410 may be in contact with its respective electrode and the top surface 405 may be in contact with its respective electrode. In some cases, only a portion of the bottom surface 410 and/or the top surface 405 contact their respective electrodes. In such cases, the portions of the bottom surface 410 and the top surface 405 that contact the electrodes may be examples of interfaces. To achieve the desired distribution of ions, the interfaces between the self-selecting memory component 220-*b* and the electrodes may have different areas.

The interfaces between the self-selecting memory component 220-*b* and the respective electrodes 205-*a*, 210-*a* may have different sizes based on the structure of the self-selecting memory component 220-*b*. The area of the top surface 405 contacting the top electrode 205-*a* may be smaller than the area of the bottom surface 410 contacting the bottom electrode 210-*a*. This may occur because the self-selecting memory component 220-*b* tapers from top surface 405 to bottom surface 410. Such an embodiment may be configured to mitigate coupling between word lines 110-*b* and still include asymmetrical electrode interfaces between the self-selecting memory component 220-*b* and the top electrode 205-*a* and the bottom electrode 210-*a*. In addition, such embodiment may also be configured to increase a distance between adjacent word lines 110-*b* and therefore, mitigate shorts between word lines 110-*b*.

Self-selecting memory component 220-*b* may be configured with a tapered profile to mitigate shorts between adjacent word lines. In some cases, the tapered profile may be a stepped configuration. The tapered profile, as illustrated in the digit line direction, may mitigate shorts between adjacent word lines 110-*b*.

Memory cells may be read by applying a voltage across self-selecting memory component 220-*b*. The voltage may be applied across self-selecting memory component 220-*b* in a predetermined polarity (e.g., a positive polarity). The voltage may be applied to top surface 405 or bottom surface 410 of the self-selecting memory component 220-*b*. In some cases, the positive polarity voltage may be applied to the surface of self-selecting memory component 220-*b* with a greater surface area in contact with the electrode. For example, the positive polarity voltage may be applied to bottom surface 410.

The threshold voltage of self-selecting memory component 220-*b* and/or resulting current through self-selecting memory component 220-*b* may depend on the location of a high resistivity region and low resistivity region within self-selecting memory component 220-*b* due to the distribution of ions in the self-selecting memory component 220-*b*. The resistivity of the region may be based on the composition of self-selecting memory component 220-*b* and/or a polarity of a programming pulse applied to the self-selecting memory component 220-*b*. For example, self-selecting memory component 220-*b* may be a chalcogenide material. Additionally, a logic state stored on self-selecting memory component 220-*b* may be outputted based on the positive polarity applied to self-selecting memory component 220-*b*.

In an additional example, a memory array may include a second self-selecting memory component 220-*b*. Similarly stated, for example, self-selecting memory component 220-*b* may be coupled to top electrode 205-*a* and bottom electrode 210-*a*. Top electrode 205-*a* may be coupled to digit line 115-*b* and bottom electrode 210-*a* may be coupled to word line 110-*b*. Self-selecting memory component 220-*b* includes surface 435 (e.g., second top surface) and surface 440 (e.g., second bottom surface), where self-selecting memory component 220-*b* tapers from surface 440 to surface 435 opposite surface 440. The first self-selecting memory component 220-*b* and the second self-selecting memory component 220-*b* may be separated by a distance between adjacent word lines 110-*b*. To mitigate shorts between adjacent word lines 110-*b*, the distance between adjacent word lines may be increased or maintained using the specific features of the tapered profile of first self-selecting memory component 220-*b* and the second self-selecting memory component 220-*b*. In some cases, the distance between adjacent word lines 110-*b* may be affected based on geometric profile of the self-selecting memory component 220-*b*. Bottom surface 410 includes edge 455 (e.g., first edge) and surface 440 includes edge 460 (e.g., second edge). Top surface 405 includes edge 445 (e.g., third edge) and surface 435 includes edge 450 (e.g., fourth edge). The distance between edge 455 and edge 460 is less than the distance between edge 445 and edge 450. That is, adjacent self-selecting memory component 220-*b* taper from a first surface to a second surface. In some cases, the taper from a first surface to a second surface may increase or maintain a distance between adjacent word lines, therefore, mitigating shorts between word lines.

In an additional example, a memory array may include a third self-selecting memory component 220-*b*. Similarly stated, for example, self-selecting memory component 220-*b* may be coupled to top electrode 205-*a* and bottom electrode 210-*a*. Top electrode 205-*a* may be coupled to digit line 115-*b* and bottom electrode 210-*a* may be coupled to word line 110-*b*. Self-selecting memory component 220-*b* includes surface 465 (e.g., third top surface) and surface 470 (e.g., third bottom surface,) where self-selecting memory component 220-*b* has a straight profile from surface 465 to surface 470 opposite surface 465.

Figure 5A:
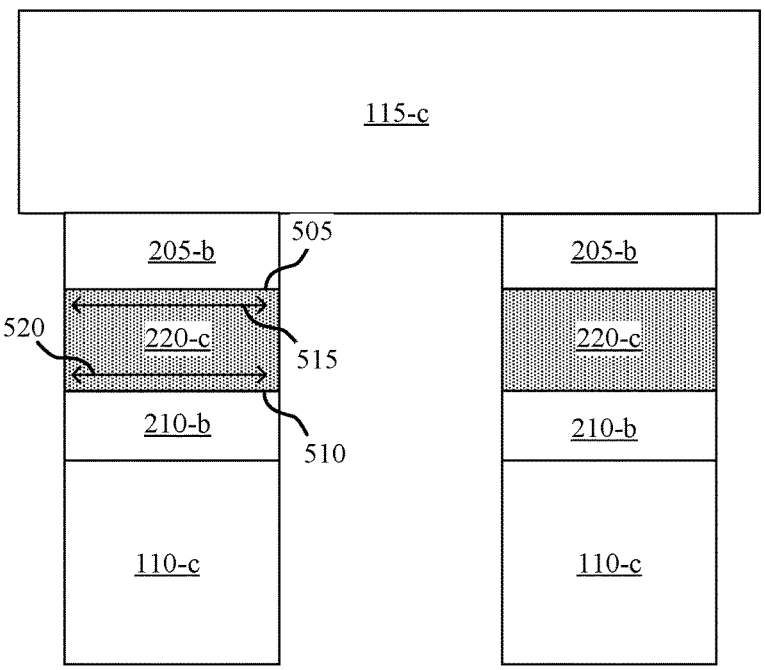
FIGS. 5A-5B illustrate an example of a memory array that supports tapered memory cell profiles in accordance with examples of the present disclosure.
Figure 5B:
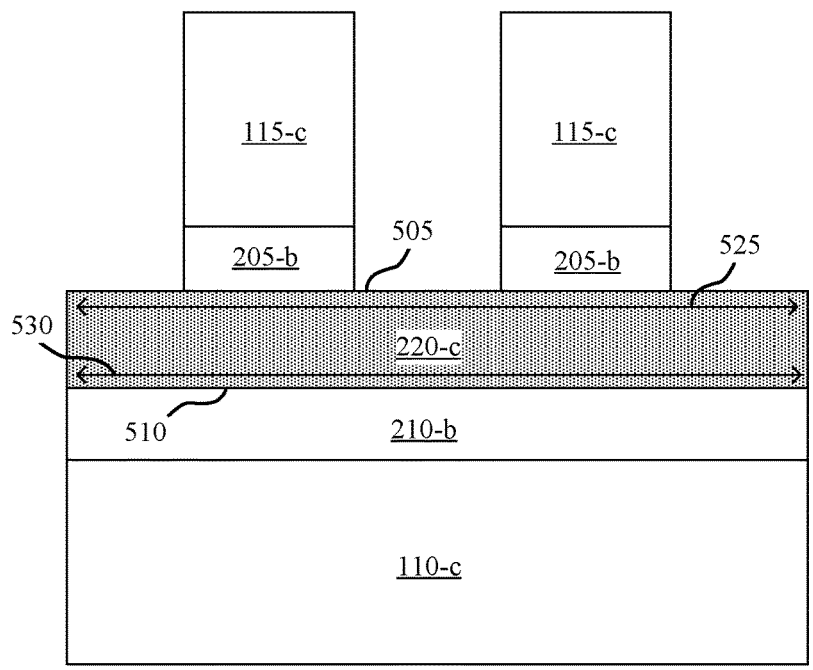

FIGS. 5A-5B illustrate an example of a memory array that supports tapered memory cell profiles in accordance with examples of the present disclosure. Self-selecting memory component 220-*c* is shown from a first cross-sectional view 500-*a* in a word line etch direction and a second cross-sectional view 500-*b* in a digit line etch direction. The self-selecting memory component 220-*c* may be coupled to top electrode 205-*b* (e.g., second electrode) and bottom electrode 210-*b* (e.g., first electrode). The self-selecting memory component 220-*c* may have a straight profile of memory array in a word line direction (e.g., second direction) and a straight profile in a digit line direction (e.g., first direction). Top electrode 205-*b* may be coupled to digit line 115-*c* and bottom electrode 210-*b* may be coupled to word line 110-*c*.

Self-selecting memory component 220-*c* includes top surface 505 (e.g., second surface) and bottom surface 510 (e.g., first surface). Top surface 505 may be opposite of bottom surface 510. In the word line direction, length 515 may be equal to length 520. Therefore, the cross-section of self-selecting memory component 220-*c* may be a rectangle in the word line direction. In the digit line direction, length 525 may be equal to length 530. Therefore, the cross-section of self-selecting memory component 220-*b* may be a rectangle in the digit line direction. Self-selecting memory component 220-*c* may be a prism. In some cases, bottom surface 510 may have a greater area in contact with bottom electrode 210-*b* than an area of top surface 505 in contact with top electrode 205-*b*. Bottom surface 510 may also have a greater area than top surface 505 coupled with word line 110-*b*.

In some case, the area of contact between bottom electrode 210-*b* and bottom surface 510 of self-selecting memory component 220-*c* may be an electrode interface. Similarly, the area of contact between top electrode 205-*b* and top surface 505 of self-selecting memory component 220-*c* may be an electrode interface. The bottom surface 510 may be in contact with its respective electrode and the top surface 505 may be in contact with its respective electrode. In some cases, only a portion of the bottom surface 510 and/or the top surface 505 contact their respective electrodes. In such cases, the portions of the bottom surface 510 and the top surface 505 that contact the electrodes may be examples of interfaces. To achieve the desired distribution of ions, the interfaces between the self-selecting memory component 220-*c* and the electrodes may have different areas.

The interfaces between the self-selecting memory component 220-*c* and the respective electrodes 205-*b*, 210-*b* may have different sizes based on the structure of the self-selecting memory component 220-*c*, even though the self-selecting memory component 220-*c* does not have a tapered profile. The area of the top surface 505 contacting the top electrode 205-*b* may be smaller than the area of the bottom surface 510 contacting the bottom electrode 210-*b*. This may occur because the self-selecting memory component 220-*c* and the bottom electrode 210-*b* may extend along the length of the word line 110-*c*. Such an embodiment may be configured to mitigate coupling between word lines 110-*c* and still include asymmetrical electrode interfaces between the self-selecting memory component 220-*c* and the top electrode 205-*b* and the bottom electrode 210-*b*. In addition, such embodiment may also be configured to increase a distance between adjacent word lines 110-*c* and therefore, mitigate shorts between word lines 110-*c*.

Self-selecting memory component 220-*c* may be configured with a tapered profile to mitigate shorts between adjacent word lines. In some cases, the effects of the tapered profile may be achieved through varying an area of self-selecting memory component 220-*c* in contact with the electrodes. For example, length 520 and length 530 may determine a first area of bottom surface 510 in contact with bottom electrode 210-*b*. Further, length 515 and length 525 may determine a second area of top surface 505 in contact with top electrode 205-*b*. The first area and the second area may determine a ratio. This ratio may further define a sense window associated with self-selecting memory component 220-*c* by crowding the ions at or near bottom electrode 210-*b* or top electrode 205-*b* when self-selecting memory component stores the logic state. Additionally, a distance between digit lines 115-*c* may mitigate shorts in adjacent digit lines.

In some cases, self-selecting memory component 220-*c* may be etched in the word line direction and not etched in the digit line direction. Therefore, self-selecting memory component 220-*c* may be continuous along adjacent digit lines 115-*c* in the digit line direction. This continuity may impede movement of ions in self-selecting memory component 220-*c*.

Memory cells may be read by applying a voltage across self-selecting memory component 220-*c*. The voltage may be applied across self-selecting memory component 220-*c* in a predetermined polarity (e.g., a positive polarity). The voltage may be applied to top surface 505 or bottom surface 510 of the self-selecting memory component 220-*c*. The threshold voltage of self-selecting memory component 220-*c* and/or resulting current through self-selecting memory component 220-*c* may depend on the location of a high resistivity region and low resistivity region within self-selecting memory component 220-*c* due to the ion migration. The resistivity of the region may be based on the composition of self-selecting memory component 220-*c*. For example, self-selecting memory component 220-*c* may be a chalcogenide material. Additionally, a logic state stored on self-selecting memory component 220-*c* may be outputted based on the positive polarity applied to self-selecting memory component 220-*c*.

The threshold voltage of self-selecting memory component 220-*c* and/or resulting current through self-selecting memory component 220-*c* may depend on the location of a high resistivity region and low resistivity region within self-selecting memory component 220-*c* due to the distribution of ions in the self-selecting memory component 220-*c*. The resistivity of the region may be based on the composition of self-selecting memory component 220-*c* and/or a polarity of a programming pulse applied to the self-selecting memory component 220-*c*. For example, self-selecting memory component 220-*c* may be a chalcogenide material. Additionally, a logic state stored on self-selecting memory component 220-*c* may be outputted based on the positive polarity applied to self-selecting memory component 220-*c*.

One or more self-selecting memory components 220-*c* may be separated by a distance between adjacent word lines 110-*c*. To mitigate shorts between adjacent word lines 110-*c*, the distance between adjacent word lines 110-*c* may increase or be maintained. In some cases, the distance between adjacent word lines 110-*c* may be affected based on geometric profile of the self-selecting memory component 220-*c*.

Figure 6A:
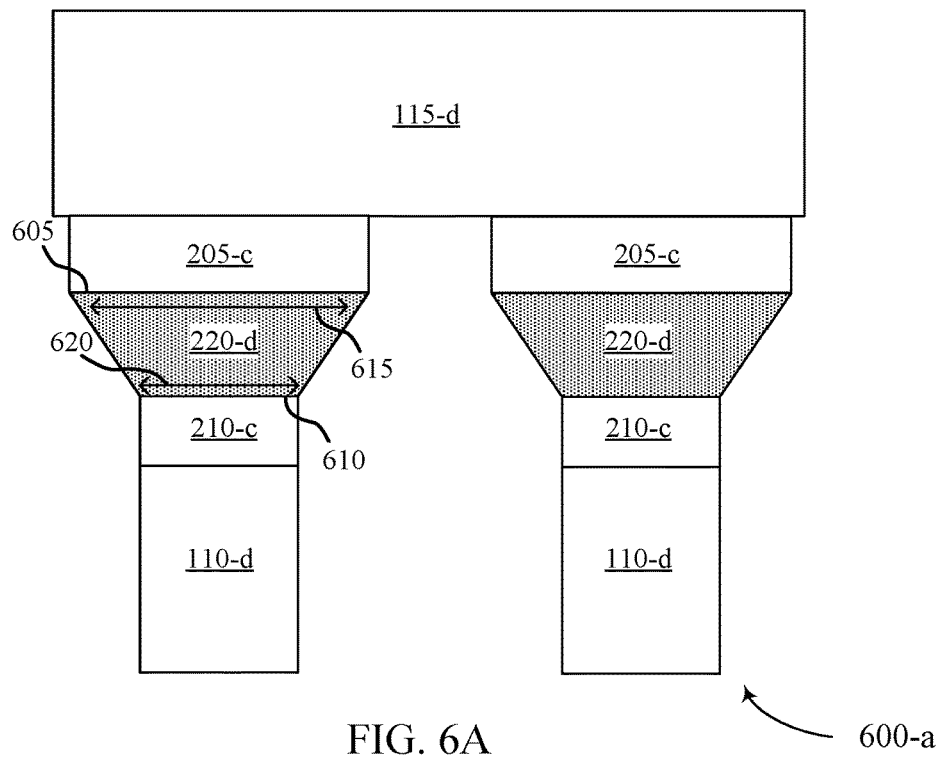
FIGS. 6A-6B illustrate illustrates an example of a memory array that supports tapered memory cell profiles in accordance with examples of the present disclosure.
Figure 6B:
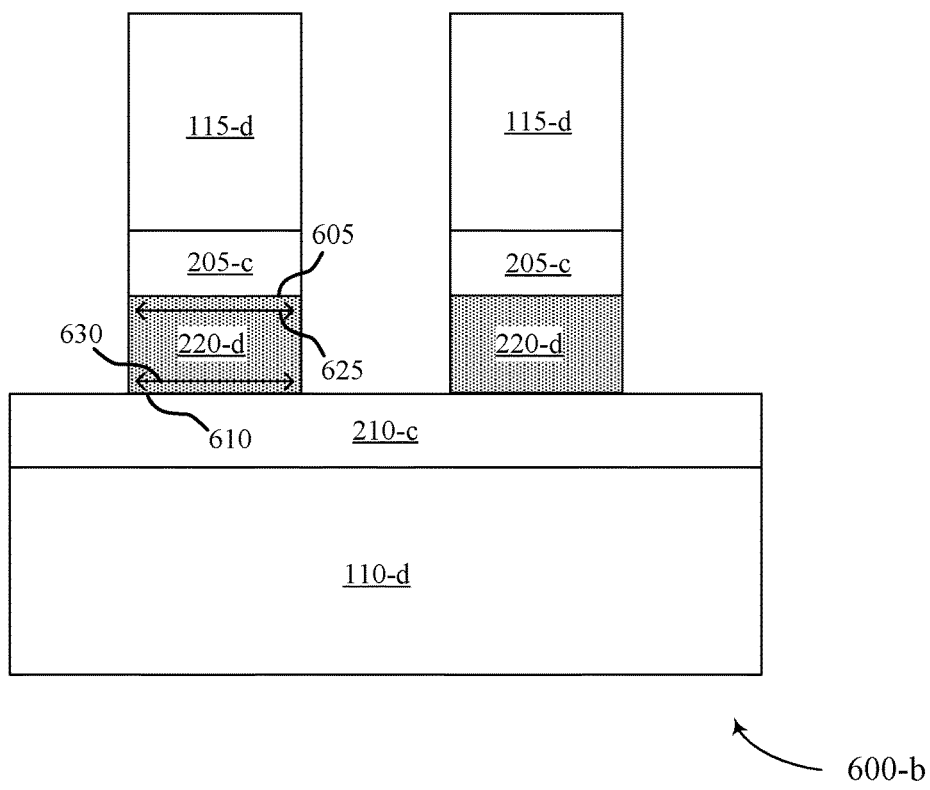

FIGS. 6A-6B illustrate an example of a memory array that supports tapered memory cell profiles in accordance with examples of the present disclosure. Self-selecting memory component 220-*d* is shown from a first cross-sectional view 600-*a* in a word line etch direction and a second cross-sectional view 600-*b* in a digit line etch direction. The self-selecting memory component 220-*d* may be coupled to top electrode 205-*c* and bottom electrode 210-*c*. The self-selecting memory component 220-*d* may have a tapered profile of memory array in a word line direction (e.g., first direction), and a straight profile in a digit line direction (e.g., second direction). Top electrode 205-*c* may be coupled to digit line 115-*d* and bottom electrode 210-*c* may be coupled to word line 110-*d*.

Self-selecting memory component 220-*d* includes top surface 605 and bottom surface 610. Top surface 605 may be opposite of bottom surface 610. In some cases, top surface 605 may have a greater area than bottom surface 610. In the word line direction, length 615 (e.g., first top length) may be less than length 620 (e.g., first bottom length). Therefore, the cross-section of self-selecting memory component 220-*d* may be an inverted trapezoid in the word line direction. In the digit line direction, length 625 (e.g., second top length) may be equal to length 630 (e.g., second bottom length). Therefore, the cross-section of self-selecting memory component 220-*d* may be a rectangle in the digit line direction. Self-selecting memory component 220-*d* may be a trapezoidal prism. Self-selecting memory component 220-*d* may be configured with a tapered profile to mitigate shorts between adjacent word lines. The tapered profile, as illustrated in the word line direction, may mitigate shorts between adjacent word lines 110-*d*.

In some case, the area of contact between bottom electrode 210-*c* and bottom surface 610 of self-selecting memory component 220-*d* may be an electrode interface. Similarly, the area of contact between top electrode 205-*c* and top surface 605 of self-selecting memory component 220-*d* may be an electrode interface. The bottom surface 610 may be in contact with its respective electrode and the top surface 605 may be in contact with its respective electrode. In some cases, only a portion of the bottom surface 610 and/or the top surface 605 contact their respective electrodes. In such cases, the portions of the bottom surface 610 and the top surface 605 that contact the electrodes may be examples of interfaces. To achieve the desired distribution of ions, the interfaces between the self-selecting memory component 220-*d* and the electrodes may have different areas.

The interfaces between the self-selecting memory component 220-*d* and the respective electrodes 205-*c*, 210-*c* may have different sizes based on the structure of the self-selecting memory component 220-*d*. The area of the top surface 605 contacting the top electrode 205-*c* may be larger than the area of the bottom surface 610 contacting the bottom electrode 210-*c*. This may occur because the self-selecting memory component 220-*d* tapers from bottom surface 610 to top surface 605. Such an embodiment may be configured to mitigate coupling between word lines 110-*d* and still include asymmetrical electrode interfaces between the self-selecting memory component 220-*d* and the top electrode 205-*c* and the bottom electrode 210-*c*. In addition, such embodiment may also be configured to increase a distance between adjacent word lines 110-*d* and therefore, mitigate shorts between word lines 110-*d*.

One or more self-selecting memory components 220-*d* may be separated by a distance between adjacent word lines 110-*d*. To mitigate shorts between adjacent word lines 110-*d*, the distance between adjacent word lines 110-*d* may increase or be maintained due to the tapered profile of the one or more self-selecting memory components 220-*d*. In some cases, the distance between adjacent word lines 110-*d* may be affected based on geometric profile of the self-selecting memory component 220-*d*.

Memory cells may be read by applying a voltage across self-selecting memory component 220-*d*. The voltage may be applied across self-selecting memory component 220-*d* in a predetermined polarity (e.g., a positive polarity). The voltage may be applied to top surface 605 or bottom surface 610 of the self-selecting memory component 220-*d*. In some cases, the positive polarity voltage may be applied to the surface of self-selecting memory component 220-*d* with a greater surface area in contact with the electrode. For example, the positive polarity voltage may be applied to top surface 605.

The threshold voltage of self-selecting memory component 220-*d* and/or resulting current through self-selecting memory component 220-*d* may depend on the location of a high resistivity region and low resistivity region within self-selecting memory component 220-*d* due to the distribution of ions in the self-selecting memory component 220-*d*. The resistivity of the region may be based on the composition of self-selecting memory component 220-*d* and/or a polarity of a programming pulse applied to the self-selecting memory component 220-*d*. For example, self-selecting memory component 220-*d* may be a chalcogenide material. Additionally, a logic state stored on self-selecting memory component 220-*d* may be outputted based on the positive polarity applied to self-selecting memory component 220-*d*.

Figure 7A:
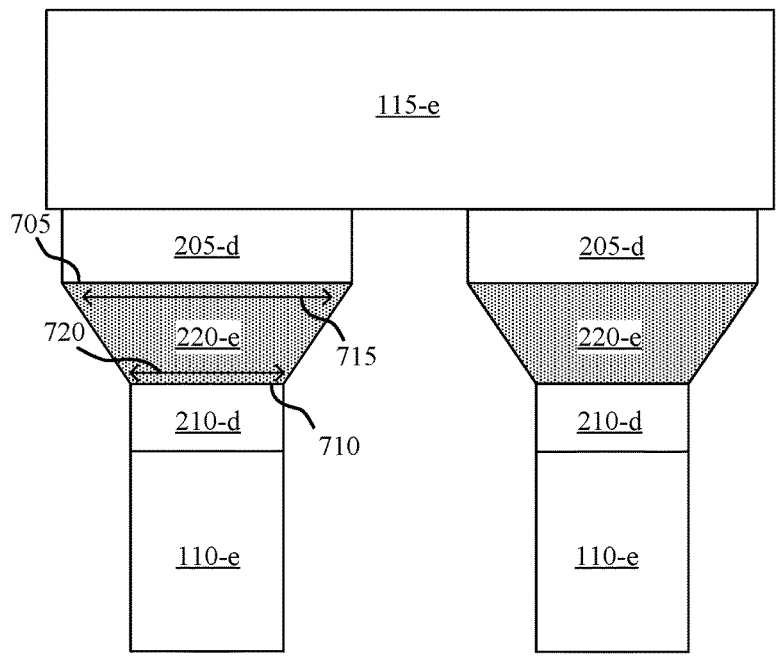
FIGS. 7A-7B illustrate illustrates an example of a memory array that supports tapered memory cell profiles in accordance with examples of the present disclosure.
Figure 7B:
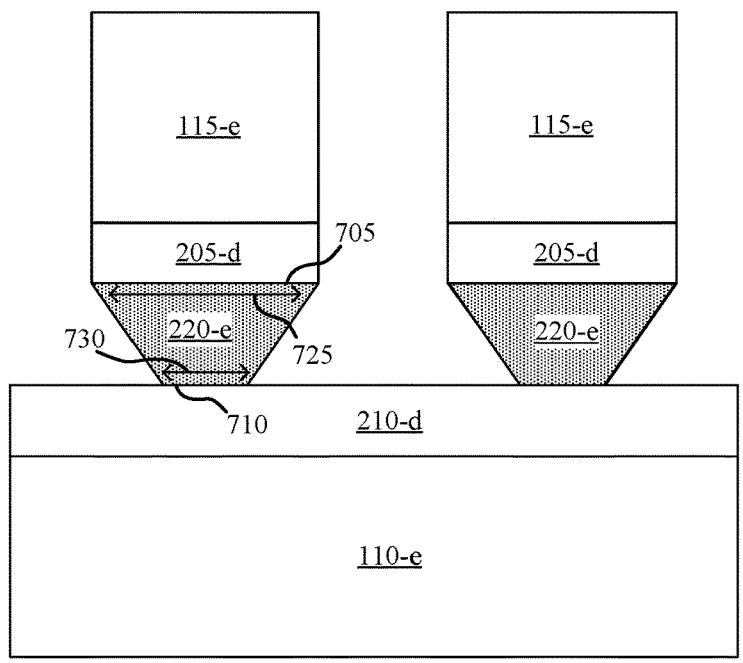

FIGS. 7A-7B illustrate an example of a memory array that supports tapered memory cell profiles in accordance with examples of the present disclosure. Self-selecting memory component 220-*e* is shown from a first cross-sectional view 700-*a* in a word line etch direction and a second cross-sectional view 700-*b* in a digit line etch direction. The self-selecting memory component 220-*e* may be coupled to top electrode 205-*d* and bottom electrode 210-*d*. The self-selecting memory component 220-*e* may have a tapered profile of memory array in a word line direction (e.g., first direction), and a tapered profile in a digit line direction (e.g., second direction). Top electrode 205-*d* may be coupled to digit line 115-*e* and bottom electrode 210-*d* may be coupled to word line 110-*e*.

Self-selecting memory component 220-*e* includes top surface 705 and bottom surface 710. Top surface 705 may be opposite of bottom surface 710. In some cases, top surface 705 may have a greater area than bottom surface 710. In the word line direction, length 715 (e.g., first top length) may be greater than length 720 (e.g., first bottom length). Therefore, the cross-section of self-selecting memory component 220-*e* may be an inverted trapezoid in the word line direction. In the digit line direction, length 725 (e.g., second top length) may be greater than length 730 (e.g., second top length). Therefore, the cross-section of self-selecting memory component 220-*e* may be an inverted trapezoid in the digit line direction. Self-selecting memory component 220-*e* may be a trapezoidal prism. In some examples, self-selecting memory component 220-*e* may be a frustum. A frustum, as used herein, includes a shape of or resembling the portion of a cone or pyramid with the upper portion removed, or a shape of or resembling the portion of a cone or pyramid between a first plane that intercepts the cone or pyramid below the top and a second plane at or above the base. The tapered profile, as illustrated in the word line and digit line direction, may mitigate shorts between adjacent word lines 110-*e*.

In some case, the area of contact between bottom electrode 210-*d* and bottom surface 710 of self-selecting memory component 220-*e* may be an electrode interface. Similarly, the area of contact between top electrode 205-*d* and top surface 705 of self-selecting memory component 220-*e* may be an electrode interface. The bottom surface 710 may be in contact with its respective electrode and the top surface 705 may be in contact with its respective electrode. In some cases, only a portion of the bottom surface 710 and/or the top surface 705 contact their respective electrodes. In such cases, the portions of the bottom surface 710 and the top surface 705 that contact the electrodes may be examples of interfaces. To achieve the desired distribution of ions, the interfaces between the self-selecting memory component 220-*e* and the electrodes may have different areas.

The interfaces between the self-selecting memory component 220-*e* and the respective electrodes 205-*d*, 210-*d* may have different sizes based on the structure of the self-selecting memory component 220-*e*. The area of the top surface 705 contacting the top electrode 205-*d* may be larger than the area of the bottom surface 710 contacting the bottom electrode 210-*d*. This may occur because the self-selecting memory component 220-*e* tapers from bottom surface 710 to top surface 705. Such an embodiment may be configured to mitigate coupling between word lines 110-*e* and still include asymmetrical electrode interfaces between the self-selecting memory component 220-*e* and the top electrode 205-*d* and the bottom electrode 210-*d*. In addition, such embodiment may also be configured to increase a distance between adjacent word lines 110-*e* and therefore, mitigate shorts between word lines 110-*e*.

One or more self-selecting memory components 220-*e* may be separated by a distance between adjacent word lines 110-*e*. To mitigate shorts between adjacent word lines 110-*e*, the distance between adjacent word lines 110-*e* may increase or be maintained due to the tapered profile of the one or more self-selecting memory components 220-*e*. In some cases, the distance between adjacent word lines 110-*e* may be affected based on geometric profile of the self-selecting memory component 220-*e*.

Memory cells may be read by applying a voltage across self-selecting memory component 220-*e*. The voltage may be applied across self-selecting memory component 220-*e* in a predetermined polarity (e.g., a positive polarity). The voltage may be applied to top surface 705 or bottom surface 710 of the self-selecting memory component 220-*e*. In some cases, the positive polarity voltage may be applied to the surface of self-selecting memory component 220-*e* with a greater surface area in contact with the electrode. For example, the positive polarity voltage may be applied to bottom surface 710.

The threshold voltage of self-selecting memory component 220-*e* and/or resulting current through self-selecting memory component 220-*e* may depend on the location of a high resistivity region and low resistivity region within self-selecting memory component 220-*e* due to the distribution of ions in the self-selecting memory component 220-*e*. The resistivity of the region may be based on the composition of self-selecting memory component 220-*e* and/or a polarity of a programming pulse applied to the self-selecting memory component 220-*e*. For example, self-selecting memory component 220-*e* may be a chalcogenide material. Additionally, a logic state stored on self-selecting memory component 220-*e* may be outputted based on the positive polarity applied to self-selecting memory component 220-*e*.

Memory cell may be etched in the word line direction and digit line direction. Self-selecting memory component 220-*e* with a tapered profile in both word line direction and digit line direction results in a higher differential area of contact between top electrode 205-*d* and bottom electrode 210-*d*. A higher differential area of contact may increase a size of the sense window for the memory cell.

Figure 8:
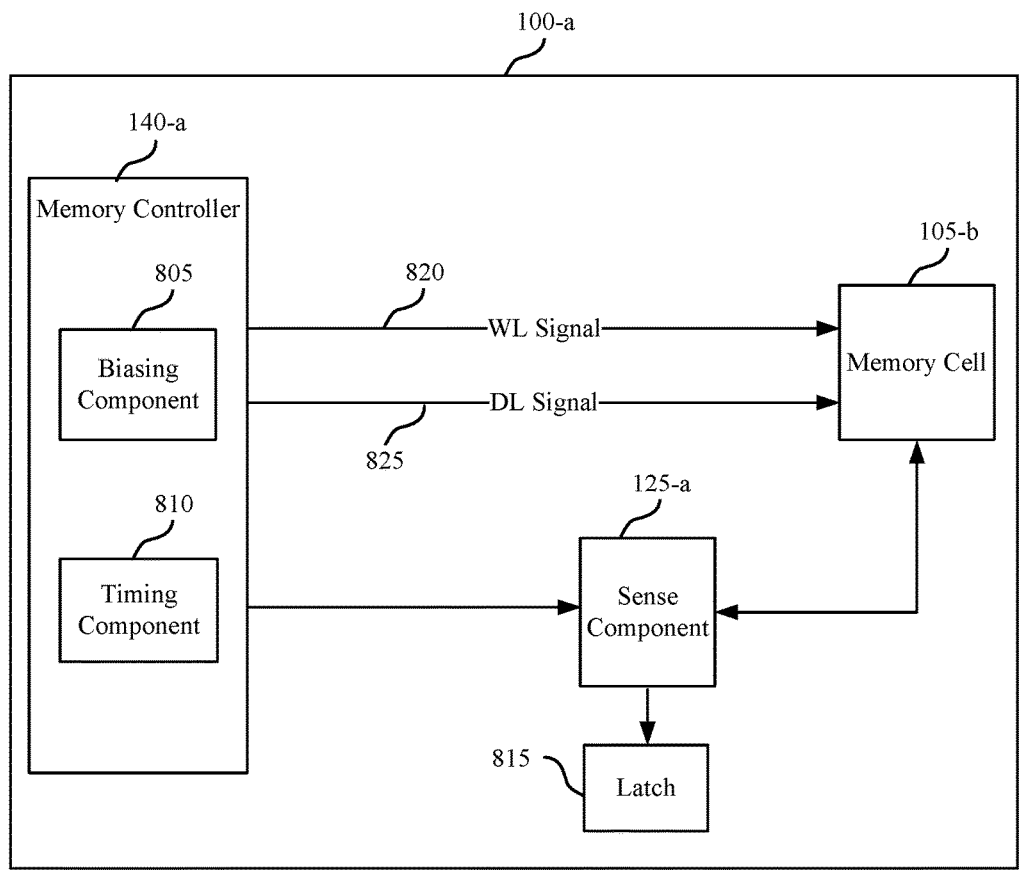
FIG. 8 illustrates an example memory array that supports tapered memory cell profiles in accordance with examples of the present disclosure.

FIG. 8 shows an example block diagram 800 of a memory array 100-*a* that supports tapered memory cell profiles in accordance with examples of the present disclosure. Memory array 100-*a* may be referred to as an electronic memory apparatus, and may be an example of a component of a memory controller 140 as described with reference to FIG. 1.

Memory array 100-*a* may include one or more memory cells 105-*b*, memory controller 140-*a*, a word line signal 820 communicated using the word line (not shown), sense component 125-*a*, digit line signal 825 communicated using a digit line (not shown), and latch 815. These components may be in electronic communication with each other and may perform one or more of the functions described herein. In some cases, memory controller 140-*a* may include biasing component 805 and timing component 810. Memory controller 140-*a* may be in electronic communication with a word line, a digit line, and sense component 125-*a*, which may be examples of word line 110, digit line 115, and sense component 125, described with reference to FIGS. 1 and 2. In some cases, sense component 125-*a* and latch 815 may be components of memory controller 140-*a*.

Memory cell 105-*b* may include a self-selecting memory component with a tapered profile. For example, the self-selecting memory component may be an example of a self-selecting memory component 220 described with reference to FIGS. 2-7.

In some examples, digit line is in electronic communication with sense component 125-*a* and memory cell 105-*b*. A logic state may be written to memory cell 105-*b*. Word line may be in electronic communication with memory controller 140-*a* and memory cell 105-*b*. Sense component 125-*a* may be in electronic communication with memory controller 140-*a*, a digit line, and latch 815. These components may also be in electronic communication with other components, both inside and outside of memory array 100-*a*, in addition to components not listed above, via other components, connections, or busses.

Memory controller 140-*a* may be configured to send a word line signal 820 or digit line signal 825 by applying voltages to those various nodes. For example, biasing component 805 may be configured to apply a voltage to operate memory cell 105-*b* to read or write memory cell 105-*b* as described above. In some cases, memory controller 140-*a* may include a row decoder, column decoder, or both, as described with reference to FIG. 1. This may enable the memory controller 140-*a* to access one or more memory cells 105-*b*. Biasing component 805 may provide a voltage for the operation of sense component 125-*a*.

In some cases, memory controller 140-*a* may perform its operations using timing component 810. For example, timing component 810 may control the timing of the various word line selections or plate biasing, including timing for switching and voltage application to perform the memory functions, such as reading and writing, discussed herein. In some cases, timing component 810 may control the operations of biasing component 805.

Upon determining a logic state of memory cell 105-*b*, sense component 125-*a* may store the output in latch 815, where it may be used in accordance with the operations of an electronic device that memory array 100-*a* is a part. Sense component 125-*a* may include a sense amplifier in electronic communication with the latch and memory cell 105-*b*.

In some examples memory controller 140-*a* may include means for performing a read operation on a self-selecting memory component that tapers from a first surface to a second surface opposite the first surface, the second surface having an area smaller than an area of the first surface.

In additional examples of the method and apparatus described above, the first surface is a bottom surface coupled with a word line and the second surface is a top surface coupled with a digit line. In addition, the first surface is a top surface coupled with a digit line and the second surface is a bottom surface coupled with a word line. In some examples, the first surface is a coupled with a word line extending in a first direction and the second surface being coupled with a plurality of digit lines extending in a second direction different from the first direction. Further, memory controller 140-*a* may include means for applying a voltage having a positive polarity to the first surface of the self-selecting memory component based at least in part on performing the read operation. Some examples of the method and apparatus described above may further include processes, features, means, or instructions for outputting a logic state stored on the self-selecting memory component based at least in part on applying the positive polarity to the first surface of the self-selecting memory component that is greater than the second surface.

Memory controller 140-*a*, or at least some of its various sub-components may be implemented in hardware, software executed by a processor, firmware, or any combination thereof. If implemented in software executed by a processor, the functions of the memory controller 140-*a* and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 140-*a* and/or at least some of its various sub-components may be physically located at various positions, including being distributed such that portions of functions are implemented at different physical locations by one or more physical devices. In some examples, memory controller 140-*a* and/or at least some of its various sub-components may be a separate and distinct component in accordance with various examples of the present disclosure. In other examples, memory controller 140-*a* and/or at least some of its various sub-components may be combined with one or more other hardware components, including but not limited to a receiver, a transmitter, a transceiver, one or more other components described in the present disclosure, or a combination thereof in accordance with various examples of the present disclosure.

Figure 9:
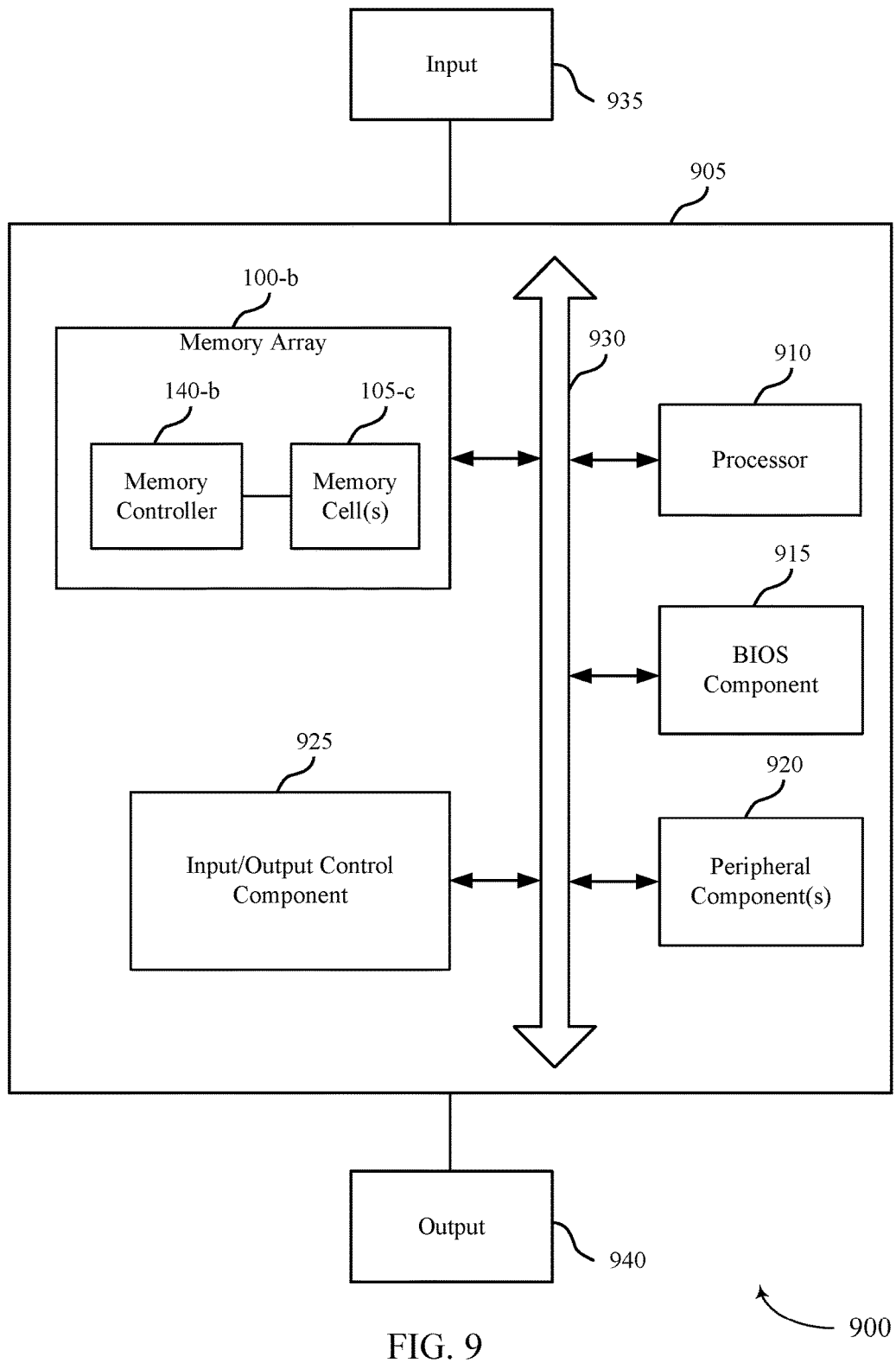
FIG. 9 illustrates a device, including a memory array, that supports programming enhancement in self-selecting memory in accordance with examples of the present disclosure.

FIG. 9 shows an example diagram of a system 900 including a device 905 that supports tapered memory cell profiles in accordance with various examples of the present disclosure. Device 905 may be an example of or include the components of memory controller 140 as described above, with reference to FIG. 1. Device 905 may include components for bi-directional voice and data communications including components for transmitting and receiving communications, including memory array 100-*b* that includes memory controller 140-*b* and memory cells 105-*c*, basic input/output system (BIOS) component 915, processor 910, I/O controller 925, and peripheral components 920. These components may be in electronic communication via one or more busses (e.g., bus 930).

Memory cells 105-*c* may store information (i.e., in the form of a logical state) as described herein. Memory cells 105-*c* may be self-selecting memory cells with a self-selecting memory component as described with reference to FIGS. 2-7, for example.

BIOS component 915 may be a software component that includes BIOS operated as firmware, which may initialize and run various hardware components. BIOS component 915 may also manage data flow between a processor and various other components, for example, peripheral components, input/output control component, etc. BIOS component 915 may include a program or software stored in read only memory (ROM), flash memory, or any other non-volatile memory.

Processor 910 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 910 may be configured to operate a memory array using a memory controller. In other cases, a memory controller may be integrated into processor 910. Processor 910 may be configured to execute computer-readable instructions stored in a memory to perform various functions (e.g., functions or tasks supporting programming enhancement in self-selecting memory).

I/O controller 925 may manage input and output signals for device 905. I/O controller 925 may also manage peripherals not integrated into device 905. In some cases, I/O controller 925 may represent a physical connection or port to an external peripheral. In some cases, I/O controller 925 may utilize an operating system such as iOS®, ANDROID®, MS-DOS®, MS-WINDOWS®, OS/2®, UNIX®, LINUX®, or another known operating system.

Peripheral components 920 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 935 may represent a device or signal external to device 905 that provides input to device 905 or its components. This may include a user interface or an interface with or between other devices. In some cases, input 935 may be managed by I/O controller 925, and may interact with device 905 via a peripheral component 920.

Output 940 may also represent a device or signal external to device 905 configured to receive output from device 905 or any of its components. Examples of output 940 may include a display, audio speakers, a printing device, another processor or printed circuit board, etc. In some cases, output 940 may be a peripheral element that interfaces with device 905 via peripheral component(s) 920. In some cases, output 940 may be managed by I/O controller 925.

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or component of such a device.

Figure 10:
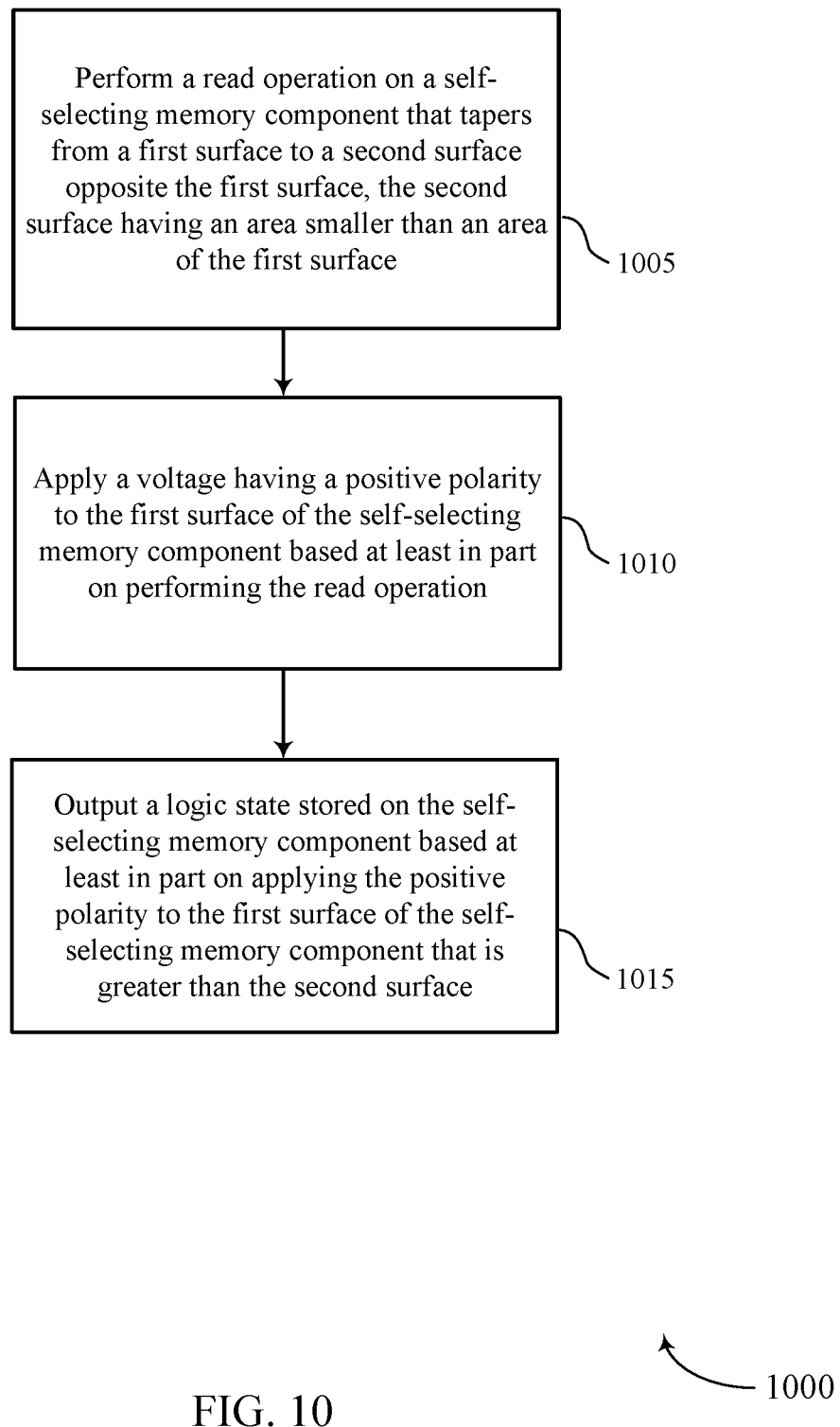
FIG. 10 is a flowchart that illustrates a method or methods for operating tapered memory cell profiles in accordance with examples of the present disclosure.

FIG. 10 shows a flowchart illustrating a method 1000 to operate a memory device that supports tapered memory cell profiles in accordance with examples of the present disclosure. The operations of method 1000 may be implemented by a memory device or its components as described herein. For example, the operations of method 1000 may be performed by a memory controller as described with reference to FIGS. 1, 8, and 9. In some embodiments, the memory controller may execute a set of codes to control the functional elements of the device to perform the functions described below. Additionally or alternatively, the memory controller may perform aspects of the functions described below using special-purpose hardware.

At block 1005, the memory controller may perform a read operation on a self-selecting memory component that tapers from a first surface to a second surface opposite the first surface, the second surface having an area smaller than an area of the first surface.

At block 1010, the memory controller may apply a voltage having a positive polarity to the first surface of the self-selecting memory component based at least in part on performing the read operation.

At block 1015, the memory controller may output a logic state stored on the self-selecting memory component based at least in part on applying the positive polarity to the first surface of the self-selecting memory component that is greater than the second surface. In some examples, the first surface is a bottom surface coupled with a word line and the second surface is a top surface coupled with a digit line. In another example, the first surface is a top surface coupled with a digit line and the second surface is a bottom surface coupled with a word line. In a further example, the first surface is a coupled with a word line extending in a first direction and the second surface being coupled with a plurality of digit lines extending in a second direction different from the first direction.

An apparatus for performing the method 1000 is described. The apparatus may include means for performing a read operation on a self-selecting memory component that tapers from a first surface to a second surface opposite the first surface, the second surface having an area smaller than an area of the first surface, means for applying a voltage having a positive polarity to the first surface of the self-selecting memory component based at least in part on performing the read operation, and means for outputting a logic state stored on the self-selecting memory component based at least in part on applying the positive polarity to the first surface of the self-selecting memory component that is greater than the second surface.

While the examples described earlier focus on tapered profiles that may monotonically increase or decrease in a given direction, this is not required. For example, the desired profile/shape of a self-selecting memory component may include an hourglass shape, a barrel shape, or any other shape.

In some cases, a barrel-like tapered profile may be beneficial. For example, when a memory cell is programmed using a given polarity, anions may drift towards one surface (e.g., a top or bottom surface) of a self-selecting memory component and cations may drift towards the opposite surface (e.g., a bottom or top surface) of the self-selecting memory component. As compared with symmetrically shaped memory cells, a self-selecting memory component having a barrel-like tapered profile, or another asymmetric profile in which the widths of the top and bottom surfaces of the self-selecting memory component are narrower than the width of a middle portion of the self-selecting memory component, may cause an increase in the concentrations of the cations and/or anions at the respective surfaces, by having narrow contact areas at each electrode and a larger, bulk ion reservoir at the middle of the self-selecting memory component, for example.

Figure 11:
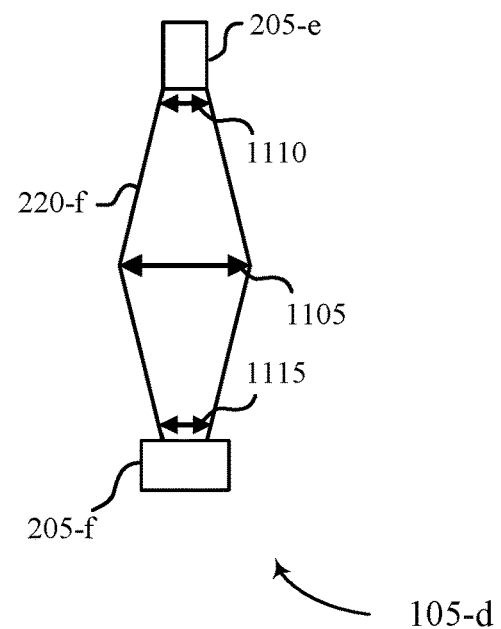
FIG. 11 illustrates example memory cells that support tapered memory cell profiles in accordance with examples of the present disclosure.
Figure 11:
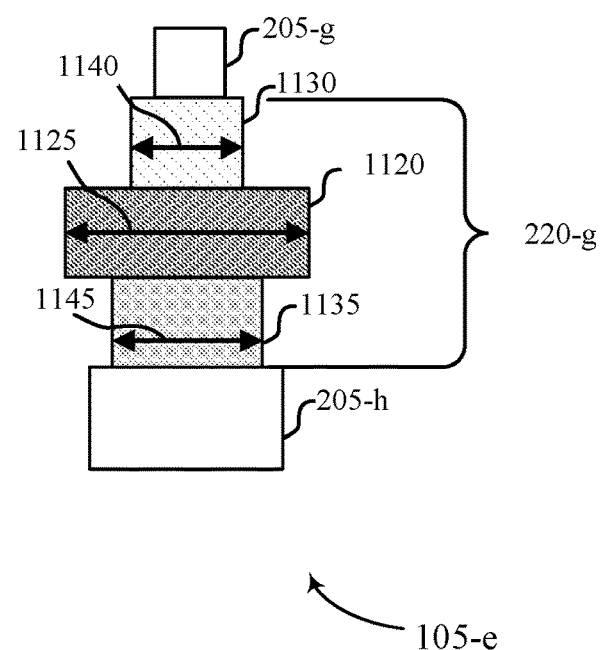

FIG. 11 illustrates example memory cells 105-*d*, 105-*e* that support tapered memory cell profiles in accordance with examples of the present disclosure. Memory cells 105-*d*, 105-*e* provide examples of asymmetric geometries in which the widths of the top and bottom surfaces of the self-selecting memory component are narrower than the width of a middle portion of the self-selecting memory component. Memory cells 105-*d* and 105-*e* have self-selecting memory component profiles that may result in anion crowding at one surface of the self-selecting memory component and cation crowding at the opposite surface, or vice versa, depending on the polarity of the operation.

The self-selecting memory component 220-*f* of memory cell 105-*d* provides an example of a barrel-like tapered profile, with a wider width 1105 near the middle of the self-selecting memory component 220-*f*, and narrower widths 1110, 1115 near the surfaces of the self-selecting memory component 220-*f* that are coupled with electrodes 205-*e*, 205-*f* In some cases, the width 1110 is similar to the width 1115. In some cases, the width 1110 is different than the width 1115. Self-selecting memory component 220-*f* may be coupled to access lines via electrodes 205-*e*, 205-*f*, for example.

The self-selecting memory component 220-*g* of memory cell 105-*e* provides an example of a stepped self-selecting memory component with a stepped profile having a first (middle) portion 1120 with a wider width 1125 relative to second portion and third portions 1130, 1135 that have narrower widths 1140, 1145 near the top and bottom surfaces of self-selecting memory component 220-*g*. In this example, the second and third portions 1130, 1135 have different widths 1140, 1145. In other examples, the second and third portions 1130, 1135 may have the same widths 1140, 1145. Self-selecting memory component 220-*g* may be coupled to access lines via electrodes 205-*g*, 205-*h*, for example.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refers to a relationship between components that supports electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Chalcogenide materials may be materials or alloys that include at least one of the elements sulfur (S), selenium (Se), and tellurium (Te). Phase change materials discussed herein may be chalcogenide materials. Chalcogenide materials and alloys may include, but not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

A transistor or transistors discussed herein may represent a field-effect transistor (FET) and comprise a three-terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
    a self-selecting memory component comprising a bottom surface having a first bottom length and a top surface having a first top length less than the first bottom length in a first direction, the bottom surface having a second bottom length and the top surface having a second top length equal to the second bottom length in a second direction;
    a top electrode coupled with the top surface of the self-selecting memory component; and
    a bottom electrode coupled with the bottom surface of the self-selecting memory component and in electronic communication with the top electrode via the self-selecting memory component.

2. The memory device of claim 1, wherein a cross-section of the self-selecting memory component comprises a rectangle in the second direction.

3. The memory device of claim 1, wherein a cross-section of the self-selecting memory component comprises a trapezoid in the first direction.

4. The memory device of claim 1, wherein the bottom surface has a greater area than the top surface.

5. The memory device of claim 1, wherein the self-selecting memory component comprises a chalcogenide material.

6. The memory device of claim 1, further comprising:
    a word line in electronic communication with the bottom electrode in the first direction, wherein the bottom surface having a greater area than the top surface is coupled with the word line; and
    a digit line in electronic communication with the top electrode in the first direction.

7. The memory device of claim 1, wherein a taper from the bottom surface to the top surface comprises a stepped taper.

8. The memory device of claim 7, wherein the taper is configured to mitigate shorts in adjacent word lines.

9. The memory device of claim 1, further comprising:
    a second self-selecting memory component that tapers from a second bottom surface to a second top surface opposite the second bottom surface,
    wherein the bottom surface of the self-selecting memory component includes a first edge and the second bottom surface of the second self-selecting memory component includes a second edge, the top surface of the self-selecting memory component includes a third edge and the second top surface of the second self-selecting memory component includes a fourth edge, wherein a distance between the first edge and the second edge is less than a distance between the third edge and the fourth edge.

10. A memory device, comprising:
a self-selecting memory component comprising a top surface having a first top length and a bottom surface having a first bottom length less than the first top length in a first direction, the top surface having a second top length and the bottom surface having a second bottom length in a second direction, the second direction different than the first direction, wherein the second top length of the top surface is greater than the second top length of the bottom surface in the second direction;
a top electrode coupled with the top surface of the self-selecting memory component; and
a bottom electrode coupled with the bottom surface of the self-selecting memory component and in electronic communication with the top electrode via the self-selecting memory component.

11. The memory device of claim 10, wherein the second top length of the top surface is equal to the second bottom length of the bottom surface in the second direction.

12. The memory device of claim 10, wherein a cross-section of the self-selecting memory component comprises an inverted trapezoid in the second direction.

13. The memory device of claim 10, wherein the bottom surface has a smaller area than the top surface.

14. The memory device of claim 10, wherein a cross-section of the self-selecting memory component comprises an inverted trapezoid in the first direction.

15. The memory device of claim 10, wherein the self-selecting memory component comprises a frustum.

16. The memory device of claim 10, wherein a taper from the top surface to the bottom surface is configured to increase a distance between adjacent word lines.

17. A method, comprising:
performing a read operation on a self-selecting memory component that tapers from a first surface to a second surface opposite the first surface, the second surface having an area smaller than an area of the first surface;
applying a voltage having a positive polarity to the first surface of the self-selecting memory component based at least in part on performing the read operation; and
outputting a logic state stored on the self-selecting memory component based at least in part on applying the positive polarity to the first surface of the self-selecting memory component that is greater than the second surface.

18. The method of claim 17, wherein the first surface is a bottom surface coupled with a word line and the second surface is a top surface coupled with a digit line.

19. The method of claim 17, wherein the first surface is a top surface coupled with a digit line and the second surface is a bottom surface coupled with a word line.

20. The method of claim 17, wherein the first surface is a coupled with a word line extending in a first direction and the second surface being coupled with a plurality of digit lines extending in a second direction different from the first direction.

* * * * *